United States Patent

Hashimoto

[11] Patent Number: 5,869,212
[45] Date of Patent: Feb. 9, 1999

[54] INTEGRATED CIRCUIT PHOTOFABRICATION MASKS AND METHODS FOR MAKING SAME

[75] Inventor: Koji Hashimoto, Yokohama, Japan

[73] Assignee: Kabushiki Kaisha Toshiba, Kawasaki, Japan

[21] Appl. No.: 652,641

[22] Filed: May 31, 1996

[51] Int. Cl.$^6$ .................................................. G03F 9/00
[52] U.S. Cl. ........................................................ 430/5
[58] Field of Search ................................................ 430/5

[56] References Cited

U.S. PATENT DOCUMENTS

| | | | |
|---|---|---|---|
| 4,902,899 | 2/1990 | Lin et al. | 250/492.1 |
| 5,045,417 | 9/1991 | Okamoto | 430/5 |
| 5,248,574 | 9/1993 | Kamon | 430/5 |
| 5,316,896 | 5/1994 | Fukuda et al. | 430/322 |
| 5,397,663 | 3/1995 | Uesawa et al. | 430/5 |
| 5,415,952 | 5/1995 | Haruki et al. | 430/5 |
| 5,432,044 | 7/1995 | Shimizu | 430/269 |
| 5,441,835 | 8/1995 | Harazaki | 430/5 |
| 5,536,602 | 7/1996 | Nakao | 430/5 |
| 5,733,687 | 3/1998 | Tanaka et al. | 430/5 |

OTHER PUBLICATIONS

K. Hashimoto et al., "The Application of Deep UV Phase Shifted–Single Layer Halftone Reticles to 256 Mbit Dynamic Random Access Memory Cell Patterns", Jpn. J. Appl. Phys. vol. 33 (1994) pp. 6823–6830.

Ito et al., "Optimization of Optical Properties for Single–Layer Halftone Masks", SPIE vol. 2197, p. 99, Jan. 1994.

C. Harper et al., "Electronic Materials & Processes Handbook", 2d ed., 1994, § 10.4, pp. 10.33–10.39.

Primary Examiner—William Krynski
Assistant Examiner—Cathy F. Lam
Attorney, Agent, or Firm—Banner & Witcoff, Ltd.

[57] ABSTRACT

An attenuated phase shifting mask employs regions of increased light transmissivity adjacent the defined circuit pattern features. Such regions can be provided by partially oxidizing a secondary region of the halftone masking layer. The result is improved image resolution and depth of focus, and a minimization of image shortening effects. In a second primary embodiment, similar improvements, as well as well as sharper corner definition, are obtained by providing on a mask (conventional or phase shifting) a generally rounded, light diffracting topography at edges of the defined circuit pattern features. This can be accomplished, for an elongated hole feature, by depositing a layer of light transmissive material on a conventional mask structure to form a generally convex light transmitting surface overlying an edge of the masking layer. In the case of a line feature, the substrate can be etched to form a recessed region including a generally concave light transmissive surface extending beneath an edge portion of the masking layer.

5 Claims, 4 Drawing Sheets

AT BEST FOCUS  AT DEFOCUS

AT BEST FOCUS  AT DEFOCUS

AT BEST FOCUS  AT DEFOCUS (a)

(b)

INTEGRATED CIRCUIT PHOTOFABRICATION MASKS AND METHODS FOR MAKING SAME

BACKGROUND OF THE INVENTION

The present invention relates to masks used in the production of semiconductor integrated circuits (IC's). More specifically, the present invention relates to mask structures and production methods for improving image resolution and depth of focus, and reducing image shortening effects, in photolithographic IC production (i.e., optical photofabrication).

Today, most semiconductor integrated circuits are formed utilizing optical photofabrication techniques. This typically involves the controlled projection of ultraviolet (UV) light through a mask (i.e., reticle) and onto a layer of light-sensitive resist material deposited on a semiconductor wafer. The mask typically embodies a light transmissive substrate with a layer of light blocking material defining a pattern of circuit features to be transferred to the resist coated wafer. If a negative acting resist is used, then the projected exposure light passing through the mask will cause the exposed areas of the resist layer to undergo polymerization and cross-linking resulting in an increased molecular weight. In a subsequent development step, unexposed portions of the resist layer will wash off with the developer, leaving a pattern of resist material constituting a reverse or negative image of the mask pattern. Alternatively, if a positive acting resist is used, the exposure light passed through the mask will cause the exposed portions of the resist layer to become soluble to the developer, such that the exposed resist layer portions will wash away in the development step, leaving a pattern of resist material corresponding directly to the mask pattern. In both cases, the remaining resist will serve to define a pattern of exposed semiconductor material that will undergo subsequent processing steps (e.g., etching and deposition) for forming the desired semiconductor devices.

The formation of circuit pattern features in the sub-micron range requires that a commensurate degree of resolution be obtained in the exposure step. Higher numerical light apertures and shorter light wavelengths (e.g., deep UV range) yield higher resolution, but at the expense of depth of focus. It is critical to increase as much as possible the depth of focus of the projected image. Typically, exposure light will be required to pass through relatively substantial resist material thicknesses, and it is important that the mask pattern be accurately projected throughout the depth of the resist material. Additionally, an increased depth of focus will minimize the adverse effects of slight deviations of the exposure tool from a best focus position (defocus conditions). Even the most precise photofabrication equipment cannot guarantee that sub-micron range deviations from a best focus position will not occur.

Recently, phase-shift masking techniques have been developed which significantly increase resolution for a given depth of focus. Phase-shifting masks (PSM's) are distinguished from conventional photolithographic masks by the employment of selectively placed mask pattern materials allowing the transmission of exposure light with a phase-shift of $\pi$ (180°). First pioneered in the early 1980's, such techniques holds great promise for extending the limits of conventional photolithography to the production of circuit features as small as 0.25 $\mu$m, and perhaps smaller. The 180° phase difference created at the mask pattern edges sets up an interference effect that significantly enhances edge contrast, resulting in higher resolution and greater depth of focus (as compared to the conventional binary intensity masks utilizing only an opaque mask pattern material, e.g., chrome). Advantageously, the technique can be employed utilizing conventional photolithographic stepper optics and resist techniques.

Numerous PSM techniques have been developed. These include alternating, subresolution, rim, and attenuated phase-shifting techniques. See generally, C. Harper et al., *Electronic Materials & Processes Handbook, 2d ed.*, 1994, § 10.4, pp. 10.33–10.39. Of these, attenuated phase-shifting techniques are among the most versatile, since they can be applied to any arbitrary mask pattern. In attenuated PSM's, a single slightly transmissive (halftone) absorber providing a phase-shift of 180° can take the place of the conventional opaque, e.g., chrome, layer of mask pattern material. Originally, halftone materials were formed of two layers: a transmittance controlling layer and a phase controlling layer. More recently, advantages have been realized through the use of single layer materials developed to perform the dual function of controlling light transmittance and phase-shift. As reported in Ito et al., *Optimization of Optical Properties for Single-layer Halftone Masks*, SPIE Vol. 2197, p.99, January 1994 (hereby incorporated by reference in its entirety), one such material comprises $SiN_x$, wherein the composition ratio is controlled by changing the amount of flowing nitrogen.

Although attenuated PSM's have proven to be one of the most useful techniques for applying actual device patterns with high resolution (see, e.g., K. Hashimoto et al., *The Application of Deep UV Phase Shifted-Single layer Halftone reticles to 256 Mbit Dynamic Random Access Memory Cell Patterns*, Jpn. J. Appl. Phys. Vol. 33 (1994) pp. 6823–6830, hereby incorporated by reference in its entirety), new techniques are required to provide even greater resolution so as to allow feature sizes at and below 0.25 $\mu$m to be consistently produced with a low defect rate. Moreover, attenuated PSM's have not eliminated the problem of image shortening effects.

Image shortening is a phenomena that reduces the attainable whole resolution. With certain feature shapes, such as elongated holes used, e.g., to provide storage node, isolation and some contact hole levels in DRAM patterns, a slight defocus will result in a substantial shortening of the hole images projected onto the underlying wafer. This results because, particularly in a defocus condition, e.g., ±1.0 $\mu$m, image intensity and contrast tend to decrease considerably toward the ends of the holes. This is illustrated by the simulated image intensity contour plots of FIG. 1B, for a conventional attenuated PSM.

Accordingly, there is a need for semiconductor photofabrication mask structures that will provide increased whole resolution and depth of focus, and which will minimize image shortening effects. There is also a need for efficient methods of producing such masks.

SUMMARY OF THE INVENTION

In view of the foregoing, it is a principal object of the present invention to provide photofabrication mask structures that provide increased whole resolution and depth of focus.

It is a further object of the present invention to provide photofabrication mask structures which will minimize image shortening effects.

Yet another object of the present invention is to provide efficient methods of producing mask structures as aforesaid, particularly methods that can be performed with conventional semiconductor processing technologies.

These and other objects are achieved in accordance with a first aspect of the present invention by an attenuated phase shifting mask comprising a light transmissive substrate and a light attenuating layer forming a circuit pattern on the substrate for projection onto a light sensitive material. The light attenuating layer comprises a primary region of light transmittance $t_1$ and a secondary region of light transmittance $t_2$ greater than $t_1$.

In another aspect, the invention is embodied in a method of making an attenuated phase shifting mask. Light attenuating material is arranged in the form of a circuit pattern on a light transmissive substrate, to form a preliminary mask structure. A secondary region of the light attenuating material is selectively partially oxidized such that the light transmittance of the secondary region is increased relative to a primary region of the light attenuating material.

In yet another aspect, the invention is embodied in an integrated circuit photofabrication mask comprising a light transmissive substrate, a masking layer forming a circuit pattern on the substrate for projection onto a light sensitive material and a surface topography including a generally rounded light transmissive surface adjacent an edge of a circuit pattern feature. The generally rounded surface serves to diffract exposure light projected therethrough so as to create on the semiconductor body an apparent mask boundary differing from an actual mask boundary.

In still another aspect, the invention is embodied in a method of making an integrated circuit photofabrication mask. A masking layer is arranged on a light transmissive substrate in the form of a circuit pattern to be projected onto a light sensitive material to form a preliminary mask structure. A generally rounded surface of light transmissive material is formed adjacent an edge of a circuit pattern feature, for diffracting exposure light projected therethrough so as to create on the semiconductor body an apparent mask boundary differing from an actual mask boundary.

These and other objects, features and advantages of the present invention will be readily apparent and fully understood from the following detailed description of the preferred embodiments, taken in connection with the appended drawings.

DETAILED DESCRIPTION OF THE PREFERRED EMBODIMENTS

Figure 4:
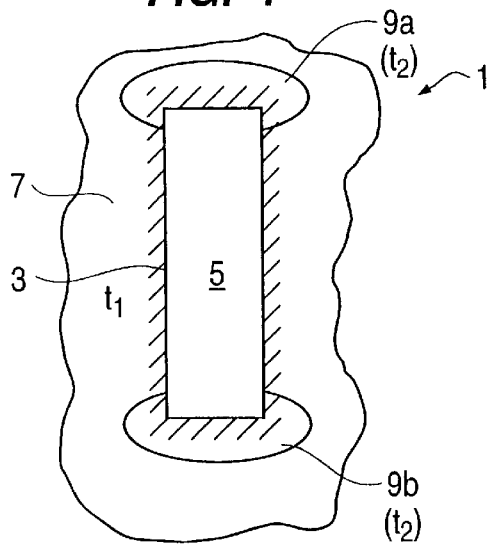
FIG. 4 is a diagrammatic top plan view illustrating an attenuated PSM hole pattern mask structure (positive resist case) in accordance with the first primary embodiment of the present invention.

FIG. 4 illustrates application of a first primary embodiment of the present invention to an attenuated PSM mask 1 including a pattern comprising elongated hole features 3. (It will be understood that the invention is equally applicable to both single layer and multi-layer masks, as are known in the art). Mask 1 comprises a light transmissive substrate 5, e.g., of quartz. A light attenuating and phase shifting masking layer 7 is arranged on substrate 1 in the form of the desired circuit pattern.

Masking layer 7 is preferably a single layer of material that performs both a light attenuating and phase shifting function, e.g., an SiNx composition as taught in the Ito et al. article mentioned in the Background section. Alternatively, masking layer 7 may comprise separate layers of light attenuating and phase shifting material, as are known in the art. The transmittance of masking layer 7 is optimized for the particular pattern, in accordance with known techniques.

The above-described structure of an attenuated PSM is modified in the present invention. In the illustrated embodiment, two regions 9a, 9b of relatively increased light transmissivity are created adjacent the opposite end portions of elongated hole feature 3. Whereas a remaining (primary) region of masking layer 3 may have a light transmissivity $t_1$, $0 < t_1 \leq 20\%$, secondary regions 9a, 9b are provided with a light transmissivity $t_2$ ($0 < t_2 \leq 20\%$) more than $t_1$. As one example, $t_1$ could equal 8% and $t_2$ could equal 10% (a difference of 2%). The optimal difference between $t_1$ and $t_2$ can be determined empirically, for a given mask pattern, by simulated or actual exposure trials, as can the optimal positioning and relative sizing of the secondary regions of increased light transmissivity. Preferably, the difference between $t_2$ and $t_1$ will not exceed 10%, and the total area of the secondary regions will not exceed ⅓ the area of the primary regions. The shapes of the secondary regions may vary, and may include rectangular, square, elliptical and circular shapes.

Figure 1A:
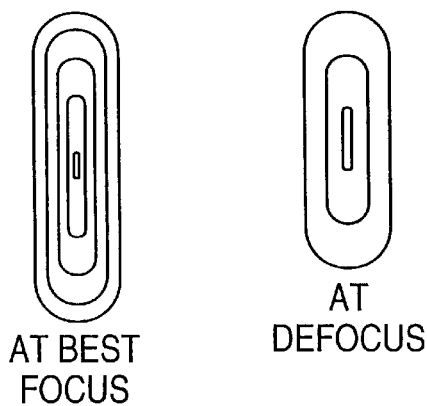
FIG. 1A depicts simulated image intensity plots for exposure light projected through an elongated hole feature of a conventional attenuated PSM, at best focus and defocus conditions.
Figure 2A:
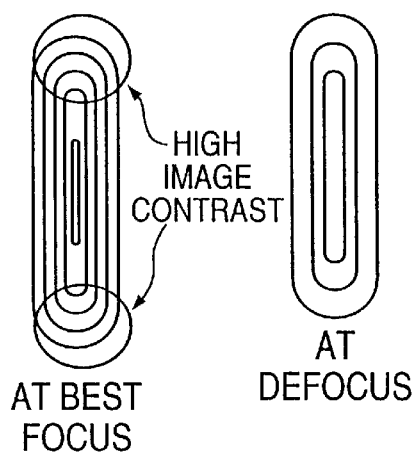
FIG. 2A depicts simulated image intensity plots for exposure light projected through an elongated hole feature of a mask made in accordance with a first primary embodiment of the present invention, at best focus and defocus conditions.

As illustrated in the simulated image intensity plot of prior art FIG. 1A, for an elongated hole feature of a conventional attenuated PSM, a slight defocus condition, e.g., ±1.0 µm, causes a considerable amount of image shortening (i.e., reduction in image contrast and intensity at the opposite ends of the elongated hole feature). The inventor has recognized that this problem is eliminated or substantially reduced by providing regions of increased transmissivity adjacent the areas where the image shortening (a reduction of image intensity) occurs. For an elongated hole, this occurs at the opposite end portions of the hole. FIG. 2A illustrates that with a mask as shown in FIG. 4, little to no image shortening occurs for the same defocus condition.

It is possible to reduce image shortening at the best focus position with oversizing of the mask features on conventional masks. Such compensation for mask bias does not solve the problem of image shortening in a defocus condition. In contrast, image shortening at defocus conditions can be reduced with the present invention. In this respect, the invention improves total lithographic performance compared with conventional masks.

Figure 1B:
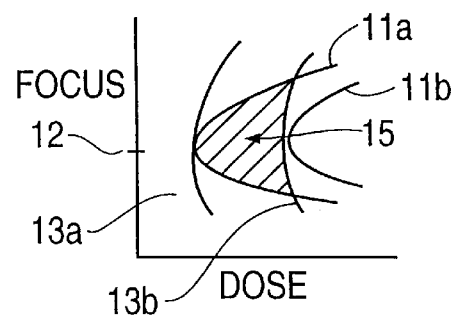
FIG. 1B graphically depicts simulated exposure-defocus curves (an E-D tree) for the elongated hole mask feature of FIG. 1A.

Regions of relatively increased transmittance, as described above, also serve to increase the whole resolution (depth of focus for certain dose latitude) which is attainable. This is illustrated, for the elongated hole feature, by a comparison of the simulated exposure-defocus curves (E-D tree) for a conventional attenuated PSM (see FIG. 1B) with that for mask 1 (see FIG. 2B). In FIG. 1B, length curves 11a, 11b represent the log of the doses required to fully expose the underlying resist material along the long sides (length dimension) of the elongated hole (to a specified critical dimension (CD) criterion, e.g., 25 nm for 0.25 µm design rule, at different focus/defocus conditions. Point 12 on the Y (focus) axis represents a best focus position. Similarly, width curves 13a, 13b represent the doses required to fully expose the underlying resist material along the short sides (width dimension) of the elongated hole.

Figure 2B:
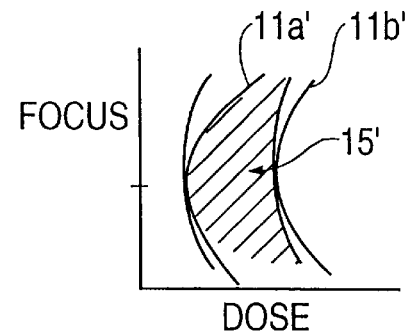
FIG. 2B graphically depicts simulated exposure-defocus curves (an E-D tree) for the elongated hole mask feature of FIG. 2A.

The hatched region 15 defined by the overlap of the areas defined between the width curves and length curves represents the whole resolution that is attainable. The maximum width of hatched region 15, measured along the y (focus) axis, represents the range of permissible deviation from best focus point 12, i.e., the depth of focus. In FIG. 2B, it can be seen that curves 11a', 11b' have far less curvature than curves 11a, 11b of FIG. 1B, resulting in a substantially wider hatched region 15. Thus, it will be appreciated that the whole resolution and depth of focus for mask 1 of the present invention is substantially greater than that for the conventional attenuated PSM.

Figure 5:
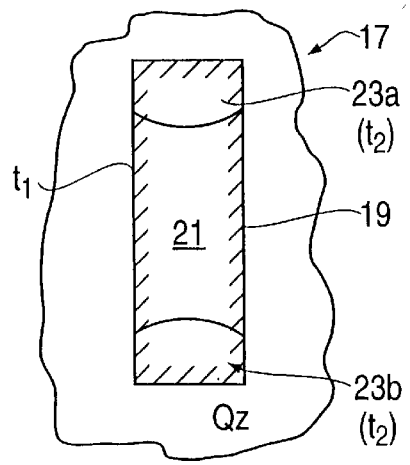
FIG. 5 is a diagrammatic top plan view illustrating an attenuated PSM line pattern mask structure (positive resist case) in accordance with the first primary embodiment of the present invention.

FIG. 5 illustrates application of the above-described principles to an attenuated PSM mask 17 including a line feature 19 (positive resist case). Similar to the embodiment of FIG. 4, the halftone masking layer 21 is provided with a primary region of light transmittance $t_1$. Adjacent the two end portions of the line feature are provided two secondary regions 23a, 23b of increased light transmittance $t_2$. The ranges stated for $t_1$ and $t_2$ for the elongated hole embodiment (FIG. 4) and the relative sizes of the primary and secondary regions thereof, are also applicable to the line feature embodiment of FIG. 5. With this arrangement, similar improvements in depth of focus, and corresponding decreases in the image shortening effect are realized.

Figure 6A:
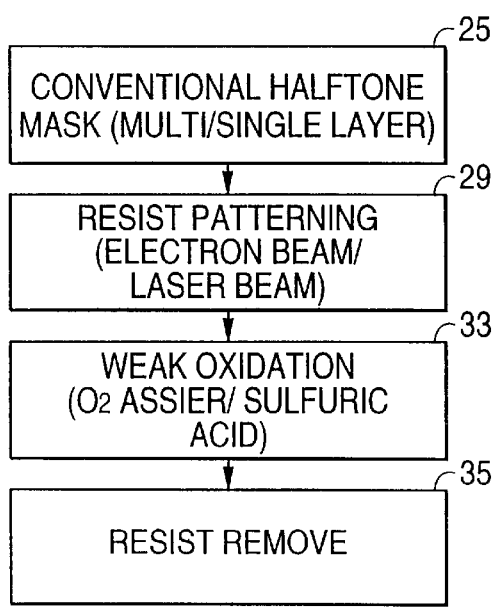
FIG. 6A is a process flow chart illustrating a method for making the mask structures of the first primary embodiment.
Figure 6B:
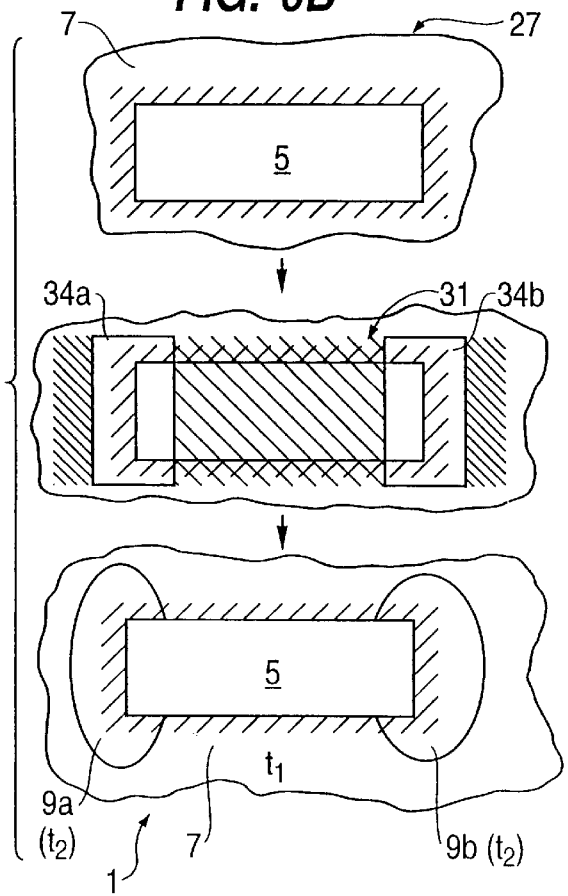
FIG. 6B presents top plan views illustrating certain of the process steps shown in FIG. 4A, for the hole pattern mask structure of FIG. 4.

With reference to FIGS. 6A and 6B, a process for making a mask in accordance with the present invention is now described. (As just one possible example, FIG. 6B shows the processing of a mask having an elongated hole feature as shown in FIG. 4.) The first step 25 is the formation of a conventional halftone mask structure 27. This involves the arrangement of halftone masking layer 7 in the form of a circuit pattern on substrate 5, using conventional techniques such as coating followed by electron beam or laser patterning.

Next, a resist material is applied to mask structure 27 and a patterning step 29 (e.g., electron beam or laser beam patterning) is performed to remove the resist from the regions of the mask corresponding to the secondary regions of increased transmissivity to be formed. This results in a resist pattern 31.

Next, in step 33, a weak oxidation treatment is carried out to partially oxidize the halftone material in the exposed secondary regions 34a, 34b. The oxidation of an SiNx halftone material will result in the formation of $SiO_2$ thus increasing light transmissivity. A weak oxidation treatment is effective to increase the light transmissivity of other half tone phase shifting materials, e.g., MoSiOxNy, CrOx, C and Cr, and the halftone layer (e.g., Cr) of multi-layer type attenuated phase shifting masks, e.g., $Cr/SiO_2$. The oxidation process should be carefully controlled in order to achieve the desired increase in light transmissivity. The oxidation agent should be chosen in light of the resist and halftone materials that are being used. The agent should be effective to oxidize the halftone material at a controllable rate, while at the same time leaving the resist layer intact. Two generally suitable oxidizing agents are $O_2$ assier (plasma) and sulfuric acid solution.

Finally, in step 35, the remaining resist material is removed, resulting in a finished mask structure 1 corresponding to that shown in FIG. 4.

A second primary embodiment of the invention is now described in terms of two preferred variations, one for an elongated hole feature, and one for a line feature. As with the first primary embodiment described above, mask structures in accordance with the second primary embodiment serve to increase the attainable whole resolution and depth of focus, and to reduce image shortening effects. Additionally, the second principal embodiment provides improved corner definition of the projected feature and is applicable to both attenuated PSM and conventional opaque mask structures. It will be appreciated that the structures of the second primary embodiment can be used alone, or in combination with the structures of the first primary embodiment.

In each of the variations, a generally rounded surface topography along edges of the circuit features of the mask is used in order to diffract light away from its normal path, in a manner that increases image intensity and contrast. This compensates for a rounding that tends to occur in photofabrication masks at the corners of circuit pattern features such as holes and lines. A certain degree of rounding is unavoidable with present mask fabrication techniques. Such rounding degrades lithography performance by exasperating the image shortening effect.

Figure 7:
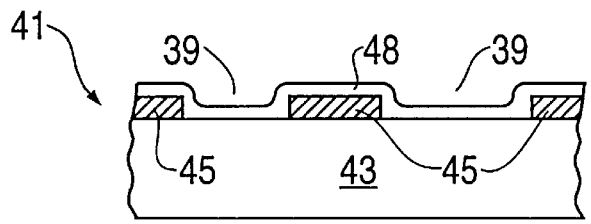
FIG. 7 is a partial cross-sectional view of a first mask structure in accordance with the second primary embodiment of the present invention.
Figure 8:
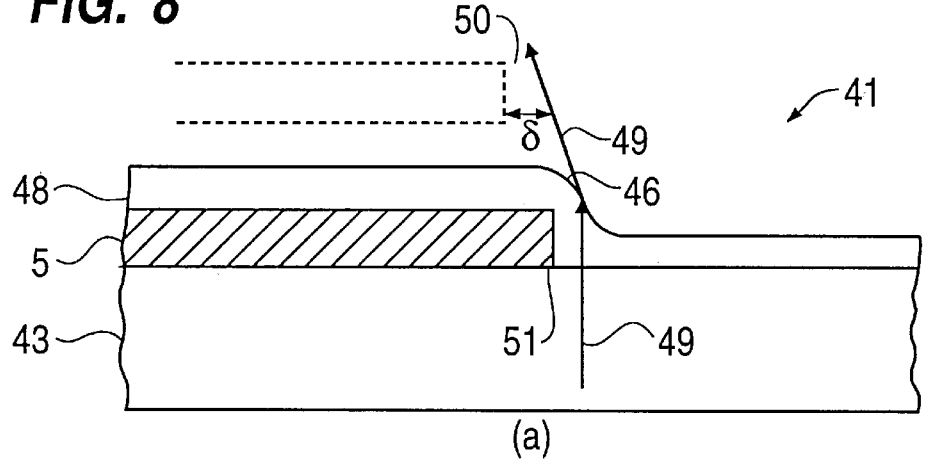
FIG. 8 is a diagrammatic close-up partial cross-sectional view of the mask structure illustrated in FIG. 7, with exposure light projected therethrough.
Figure 9:
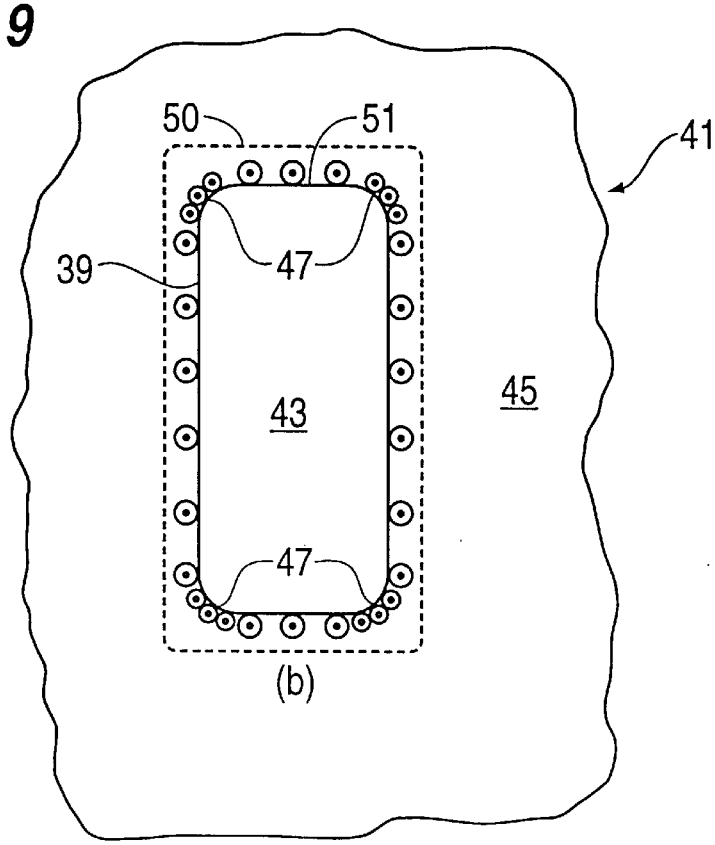
FIG. 9 is a diagrammatic top plan view of the mask structure shown in FIG. 7, with exposure light passing therethrough.

FIGS. 7–9 illustrate the first variation, wherein the circuit pattern features include an elongated hole (positive resist case) 39. A mask 41 includes a light transmissive substrate 43, e.g., of quartz, and a patterned layer of masking material 45. The masking layer may be either a light blocking opaque material, e.g., chrome, or a light attenuating and phase shifting material. If the latter, the layer may, as in the first principal embodiment, comprise either a single layer performing a dual light attenuating and phase shifting function, i.e., SiNx, or two layers performing these functions respectively.

As seen in FIG. 9, elongated hole 39 has a degree of rounding at its corners 47. This rounding reduces corner definition and has a tendency to cause image shortening on defocus (particularly in the length direction of the feature).

In the present invention, an additional layer of light transmissive material 48 is deposited on top of substrate 43 and masking layer 45, in order to create a generally rounded surface 46 overlying the edges of masking layer 45. Preferably, material 48 is an $SiO_2$ coating such as a spin-on-glass (SOG) film. Preferably, the thickness of layer 48 should generally not exceed the thickness of layer 45 by more than 50%. Such a layer has the effect of diffracting the exposure light 49 projected therethrough so as to create on the underlying resist coated wafer an apparent mask boundary 50 which is moved outwardly (typically a distance δ equal to about 100 nm) with respect to the actual mask boundary 51. This, in turn, has the effect of increasing the light intensity in the corners and improving corner definition.

As seen in FIG. 9, the size of the image projected by the mask is larger than the actual size of the mask feature (about 100 nm on each side). It is necessary to take this into account when determining the size of the mask features and any amount of demagnification.

Figure 3A:
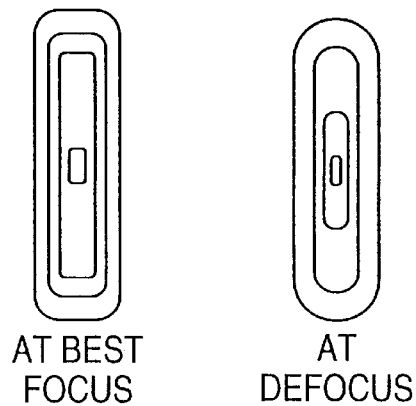
FIG. 3A depicts simulated image intensity plots for exposure light projected through an elongated hole feature of a mask made in accordance with a second primary embodiment of the present invention, at best focus and defocus conditions.

FIG. 3A shows simulated image intensity plots for the attenuated PSM of FIGS. 7–9. It can be seen that for the best focus condition, greatly improved corner definition is obtained, as compared with the simulated results shown for a conventional attenuated PSM (FIG. 1A) and the attenuated PSM of FIG. 4 (FIG. 2A). In the defocus position, the result is similar to that shown for the embodiment of FIG. 4, namely greatly reduced image shortening relative to the conventional attenuated PSM (or a conventional binary mask).

Figure 3B:
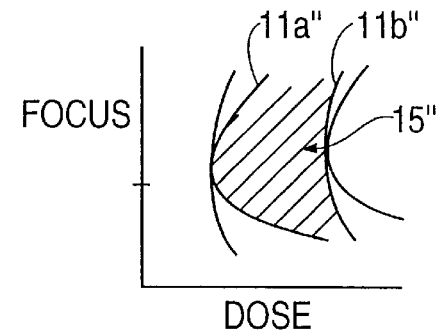
FIG. 3B graphically depicts simulated exposure-defocus curves (an E-D tree) for the elongated hole mask feature of FIG. 3A.

FIG. 3B illustrates a simulated E-D tree for the attenuated PSM of FIGS. 7–9. Similar to the result for the embodiment of FIG. 4, it can be seen that curves 11a", 11b" have far less curvature than curves 11a, 11b of FIG. 1B, resulting in a substantially wider hatched region 15" (measured along the y (focus) axis). Thus, it will be appreciated that the whole resolution and depth of focus for mask 41 of the present invention is substantially greater than that for the conventional attenuated PSM.

Figure 10:
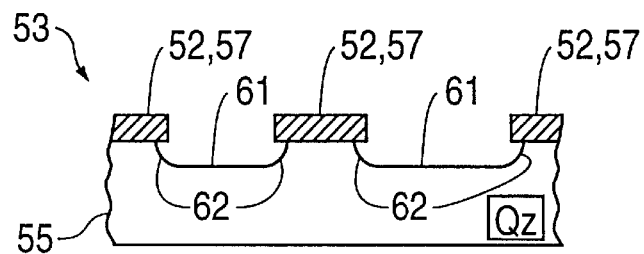
FIG. 10 is a partial cross-sectional view of a second mask structure in accordance with the second primary embodiment of the present invention.
Figure 11:
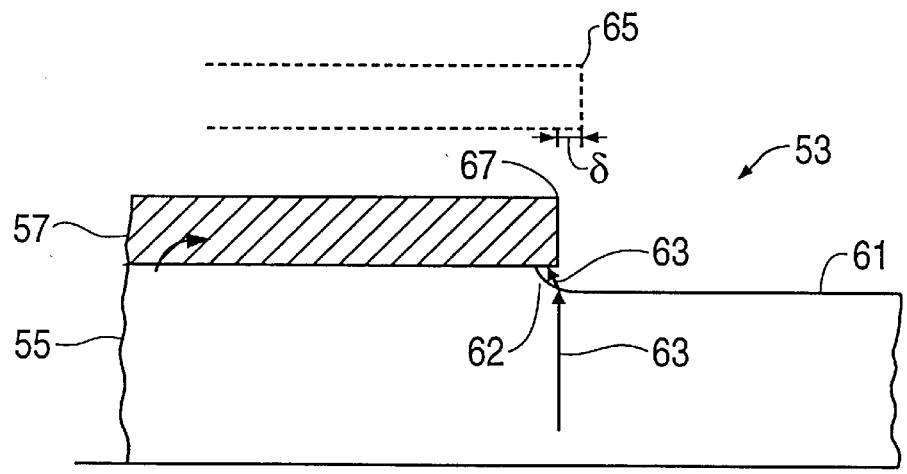
FIG. 11 is a diagrammatic close-up partial cross-sectional view of the second mask structure shown in FIG. 10, with exposure light projected therethrough.
Figure 12:
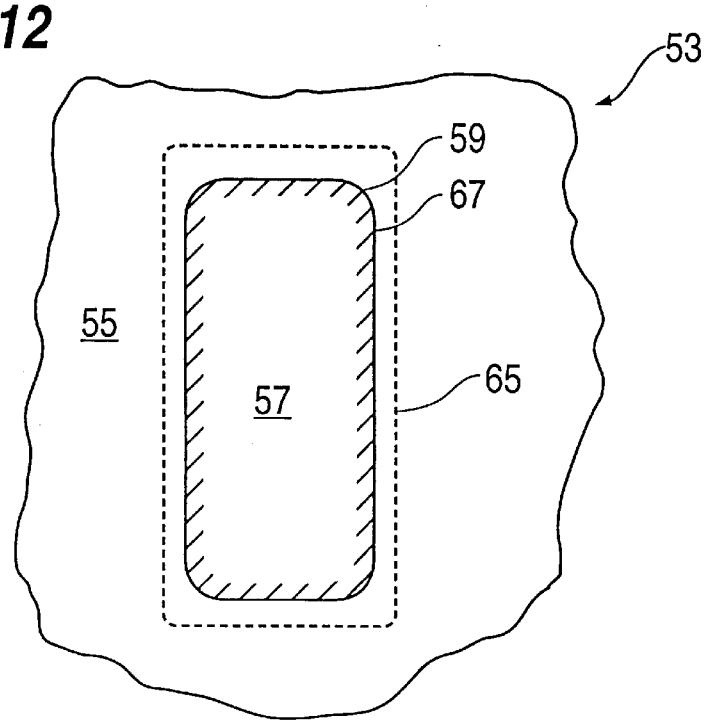
FIG. 12 is a diagrammatic top plan view of the second mask structure shown in FIG. 11, with exposure light projected therethrough.

FIGS. 10–12 illustrate a second variation of the second primary embodiment, wherein the circuit pattern includes a line feature 52 (positive resist case). Similar to the first variation illustrated in FIGS. 7–9, a mask 53 includes a light transmissive substrate 55 patterned with a layer of masking material 57. The mask material alternatives (e.g., opaque vs. attenuated PSM) described with respect to the first variation (FIGS. 7–9) apply also to the second variation.

As seen in FIG. 12, line 52 exhibits a degree of rounding at its corners 59. As in the first variation, such rounding reduces corner definition and has a tendency to cause image shortening, particularly in a defocus condition.

In the second variation, mask substrate 55 is provided with a recessed region 61 providing a generally rounded surface 62 underlying the edges of the masking layer 57. Preferably, the recessed region is formed by etching the top surface of substrate 55 to a depth not exceeding three times (3x) the thickness of masking layer 57. To make an effectual rounded topography, an isotropic etching process (e.g., either wet etching or chemical dry etching (CDE)) can be used. Rounded surface 62 has the effect of diffracting the exposure light 63 adjacent the line edges inwardly. Light 63 is blocked (or attenuated and phase shifted) by masking layer 57 so as to create an apparent mask boundary 65 which is moved outwardly with respect to the actual mask boundary 67. This, in turn, improves corner definition and increases the light intensity and image contrast in the corners of the line feature. Also, as in the first variation, a substantial increase in whole resolution and depth of focus is obtained.

The present invention has been described in terms of preferred embodiments thereof. Other embodiments, variations and modifications within the scope and spirit of the appended claims will occur to persons of ordinary skill in the art upon reviewing this disclosure.

I claim:

1. An attenuated Phase shifting mask comprising:

a light transmissive substrate; and a light attenuating layer forming a circuit pattern on said substrate for projection onto a light-sensitive material, the light attenuating layer comprising a primary region of light transmittance $t_1$ and a secondary region of light transmittance $t_2$ greater than $t_1$;

wherein said circuit pattern comprises an elongated hole feature and said secondary region of light transmittance is located adjacent opposite end portions of said elongated hole feature.

2. An attenuated phase shifting mask comprising:

a light transmissive substrate; and a light attenuating layer forming a circuit pattern on said substrate for projection onto a light-sensitive material, the light attenuating layer comprising a primary region of light transmittance $t_1$ and a secondary region of light transmittance $t_2$ greater than $t_1$;

wherein said circuit pattern comprises a line feature and a said secondary region of light transmittance is located adjacent opposite end portions of said line feature.

3. An attenuated phase shifting mask comprising:

a light transmissive substrate; and a light attenuating layer forming a circuit pattern on said substrate for projection onto a light-sensitive material, the light attenuating layer comprising a primary region of light transmittance $t_1$ and a secondary region of light transmittance $t_2$ greater than $t_1$;

wherein $0 < t_1$, $t_2 \leq 20\%$ and $0 < t_2 - t_1 \leq 10\%$.

4. A mask according to claim 3, wherein $t_1$ is about 8% and $t_2$ is about 10%.

5. An attenuated phase shifting mask comprising:

a light transmissive substrate; and a light attenuating layer forming a circuit pattern on said substrate for projection onto a light-sensitive material, the light attenuating layer comprising a primary region of light transmittance $t_1$ and a secondary region of light transmittance $t_2$ greater than $t_1$;

wherein the secondary regions have a shape of one or more of a rectangle, square, ellipse and circle, and the total of the secondary region areas is equal to or less than ⅓ the area of the primary region.

* * * * *